(12) United States Patent
Cheng et al.

(10) Patent No.: US 8,102,291 B2
(45) Date of Patent: Jan. 24, 2012

(54) SIGMA DELTA MODULATOR AND QUANTIZER AND QUANTIZATION METHOD THEREOF

(75) Inventors: Chien Hua Cheng, Xihu Township, Shanghua County (TW); Tim Kuei Shia, Taiping (TW); Jia Chun Huang, Toufen Township, Miaoli County (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 177 days.

(21) Appl. No.: 12/717,369

(22) Filed: Mar. 4, 2010

(65) Prior Publication Data

US 2011/0122009 A1 May 26, 2011

(30) Foreign Application Priority Data

Nov. 25, 2009 (TW) .............................. 98140065 A

(51) Int. Cl.
*H03M 3/00* (2006.01)
(52) U.S. Cl. ........................................ 341/143; 341/155
(58) Field of Classification Search .................. 341/143, 341/155, 144, 166; 330/10; 375/238
See application file for complete search history.

(56) References Cited

U.S. PATENT DOCUMENTS

| 6,466,087 | B2* | 10/2002 | Ruha ................................ 330/10 |
| 7,528,760 | B2* | 5/2009 | Forejt ............................ 341/166 |
| 7,728,658 | B2* | 6/2010 | Andersen et al. ............... 330/10 |
| 2004/0145504 | A1 | 7/2004 | Doerrer et al. |
| 2005/0197796 | A1* | 9/2005 | Daigle et al. .................. 702/107 |
| 2007/0222656 | A1 | 9/2007 | Melanson |
| 2010/0013554 | A1* | 1/2010 | Park .............................. 330/10 |

OTHER PUBLICATIONS

Vijay Dhanasekaran, "A 20MHz BW 68dB DR CT ΔΣ ADC Based on a Multi-Bit Time-Domain Quantizer and Feedback Element," IEEE ISSCC, pp. 174-175, Feb. 2009.

* cited by examiner

*Primary Examiner* — Peguy Jean Pierre
(74) *Attorney, Agent, or Firm* — Egbert Law Offices PLLC

(57) ABSTRACT

A quantizer of a sigma-delta modulator includes a pulse width modulator (PWM), a converter and a voltage level tracing device. The PWM receives an input signal, and generates a PWM signal according to one or more sawtooth waves and one or more reference voltages. The converter is connected to the output of the PWM and digitizes the PWM signal to generate an output digital value. The voltage level tracing device is connected to the output of the converter, and receives the output digital value to generate a reference voltage adjustment value. The reference voltage adjustment value is transmitted to the PWM for adjusting the reference voltage, so as to change the next corresponding voltage level of the sawtooth wave to track the input signal.

20 Claims, 3 Drawing Sheets

SIGMA DELTA MODULATOR AND QUANTIZER AND QUANTIZATION METHOD THEREOF

BACKGROUND (A) Field of the Application

The present application relates to a sigma-delta modulator (SDM) and the quantizer thereof, and a quantization method for the sigma-delta modulator.

(B) Description of the Related Art

There are many types of analog-to-digital converters (ADC), such as flash ADCs, pipelined ADCs, successive approximation (SA) ADCs and sigma-delta modulators (SDM). These are all commonly used ADCs and each of them is suitable for certain applications.

Because the power consumption of a flash ADC is proportional to the square of the resolution, the power consumption is increased when the resolution of a flash ADC increases. In general, the increase of the resolution will increase the number of the comparators and the power consumption. The increase of the number of comparators causes an increase in the complexity of circuit design and cost.

The resolution (N) and oversampling ratio (OSR) for a known trace type flash ADC have to comply with the equation:

$$2^N < \frac{2}{\pi} OSR,$$

and the flash ADC needs a specific start-up circuit to avoid an unstable sigma-delta modulator.

SUMMARY

The present application discloses a sigma-delta modulator (SDM) and the quantizer thereof, and quantization method for a sigma-delta modulator. A quantizer using a traditional flash ADC in the loop is replaced with a new circuit, so as to decrease the number of comparators and the power consumption.

According to an embodiment of the present application, a sigma-delta modulator includes an adder, a filter and a quantizer. The filter is connected to the output of the adder, and the quantizer is connected to the output of the filter. A digital-to-analog converter (DAC) is connected to the output of the quantizer and transmits the output data back to the adder.

In an embodiment, a quantizer includes a pulse width modulator (PWM), a converter and a voltage level tracing device. The PWM receives an input signal that is subjected to pulse width modulation according to one or more sawtooth waves and one or more reference voltages to generate a PWM signal. The converter is connected to the output of the PWM and digitizes the PWM signal to generate an output is digital value. The voltage level tracing device is connected to the output of the converter, and receives the output digital value to generate a reference voltage adjustment value. The reference voltage adjustment value is transmitted to the PWM for adjusting the reference voltage, so as to change the next corresponding voltage level of the sawtooth wave to trace the input signal.

A quantization method for a sigma-delta modulator includes the steps of: receiving an input signal; performing pulse width modulation on the input signal according to at least one sawtooth wave and at least one reference voltage to generate a PWM signal; performing time-to-digital conversion (TDC) to digitize the PWM signal so as to generate an output digital value; and generating a reference voltage adjustment value according to the output digital value to adjust the reference voltage, so as to change the next corresponding voltage level of the sawtooth wave to trace the input signal.

DESCRIPTION OF THE EMBODIMENTS

The embodiments will be explained with the appended drawings to clearly disclose the technical characteristics of the present application.

Figure 1:
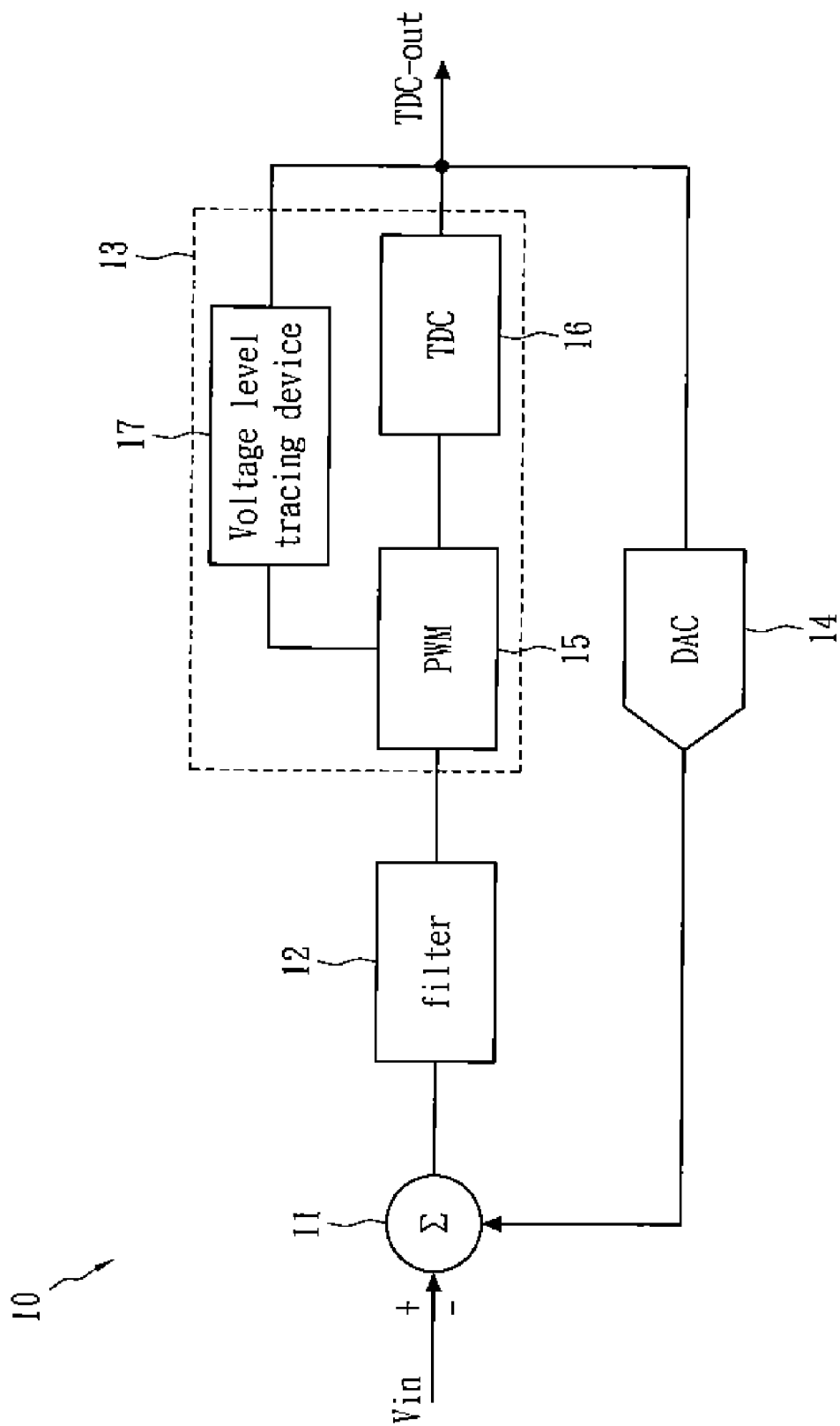
FIG. 1 shows the circuit block of a quantizer of a sigma-delta modulator in accordance with an embodiment of the present application.

FIG. 1 shows a sigma-delta modulator 10 in accordance with an embodiment of the present application. The sigma-delta modulator 10 includes an adder 11, a filter 12, a quantizer 13 and a digital-to-analog converter (DAC) 14. The filter 12 may be a loop filter and be connected to the output of the adder 11. The quantizer 13 is connected to the output of the filter 12. The DAC 14 is connected to the output of the quantizer 13, and the output data of the quantizer 13 is transmitted back to the adder 11.

In an embodiment, the quantizer 13 includes a PWM 15, a converter 16 (e.g., a time-to-digital converter (TDC)) and a (digital control) voltage level tracing device 17.

Figure 2:
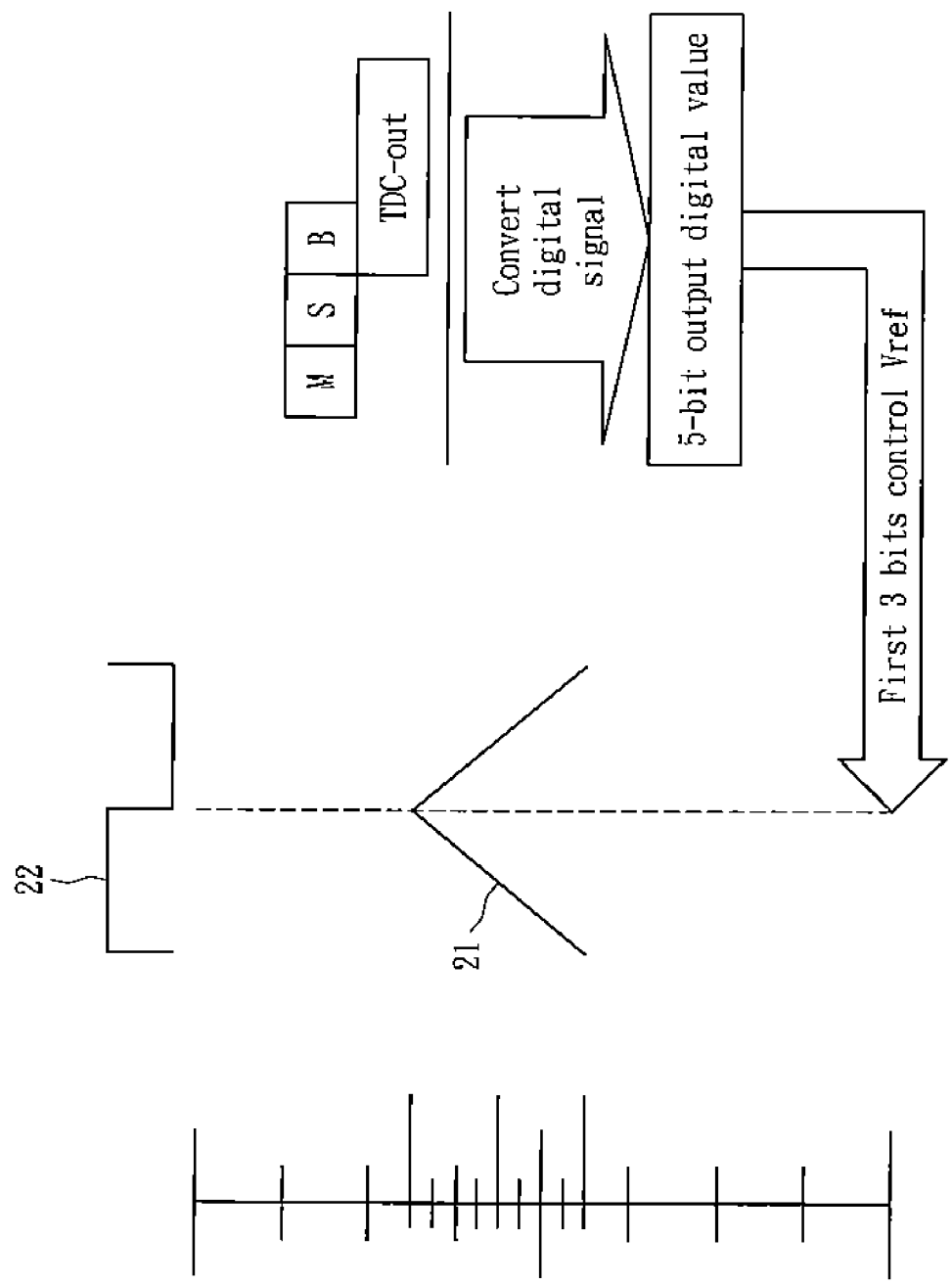
FIG. 2 shows the operation of the quantization method for a sigma-delta modulator in accordance with an embodiment of the present application.

An input signal Vin is filtered by the filter 12 and is input into a PWM 15. In the PWM 15, the input signal Vin is subjected to pulse width modulation according to a sawtooth wave and a reference voltage. As shown in FIG. 2, the fluctuation range of the sawtooth wave 21 corresponding to the clock signal 22 is decreased. For an example using 3 bits, i.e., a voltage divided into $2^3=8$ intervals, the fluctuation range can cover the voltage of the input signal Vin. The voltage range of the sawtooth wave 21 may be defined by another 3 bits. That is, the two intervals of the eight intervals are further divided into eight sub-intervals, so as to define the sawtooth wave 21. In other words, the corresponding voltage range of the sawtooth wave 21 is smaller than that of the input signal. The corresponding voltage level of the sawtooth wave 21 is defined by a first voltage range (large eight intervals) and a second voltage range (small eight intervals). The first voltage range includes the second voltage range, and the corresponding voltage level of the sawtooth wave is within the second voltage range (small eight intervals).

Because the fluctuation range of the sawtooth wave is decreased, to prevent a situation where Vin exceeds the fluctuation range of the sawtooth wave, a reference voltage Vref is provided. Vref provides the voltage shift message of Vin, so as to dynamically trace the input signal Vin. Accordingly, pulse-width modulation is performed according to whether Vin is larger than the sum of the sawtooth wave 21 and the reference voltage Vref, i.e., Vin>sawtooth wave+Vref. The formula can be rewritten as Vin−sawtooth wave>Vref, or Vin−Vref>sawtooth wave, so as to facilitate the comparison during pulse width modulation and generate a PWM signal.

The converter 16 is connected to the output of the pulse width modulator 15, and digitizes the PWM signal to generate an output digital value (TDC-out).

The voltage level tracing device 17 is connected to the output of the converter 16, and receives the output digital value to generate a reference voltage adjustment value that is transferred to the PWM 15 for adjusting the reference voltage Vref. Accordingly, the next corresponding voltage level of the sawtooth wave is changed to trace the input signal Vin.

In this embodiment, the first three bits of the output digital value TDC-out of the converter 16 are used for determining the corresponding voltage level. The first three bits of TDC-out and the first three bits (Most Significant Bit; MSB) of the output digital value of the previous reference voltage adjustment value, in which one bit is overlapped, are converted to a 5-bit output digital value. The value of the three bits of the 5-bit output digital value are used as the reference voltage adjustment value, so as to change the next corresponding voltage level of the sawtooth wave 21. Accordingly, the input signal Vin can be traced to achieve the quantizer of high resolution.

The above is merely an embodiment, and the number of employing bits is not limited to 3; the quantizer of 4-6 bits can also be practical. If the number of employing bits is m, the reference voltage adjustment value is obtained by calculating the first m bits of the previous reference voltage adjustment value and the first m bits of the output digital value. Accordingly, the reference voltage adjustment value of 2m−1 bit is obtained, in which one bit is overlapped.

In comparison with a traditional tracing quantizer that is restricted to the rule $$2^N < \frac{2}{\pi} OSR,$$

in this embodiment, OSR only needs to be larger than 8×π=25.13 (approximately half of the minimum value of the prior art). In addition, a start-up circuit is not needed for the circuitry of the present application.

According to the quantization method shown in FIG. 2, the pulse width modulation only needs a comparator. Alternatively, in order to overcome low circuit sampling rate problems, plural comparators (2 or 3 comparators) also can be employed to achieve high circuit performance, as illustrated below.

Figure 3:
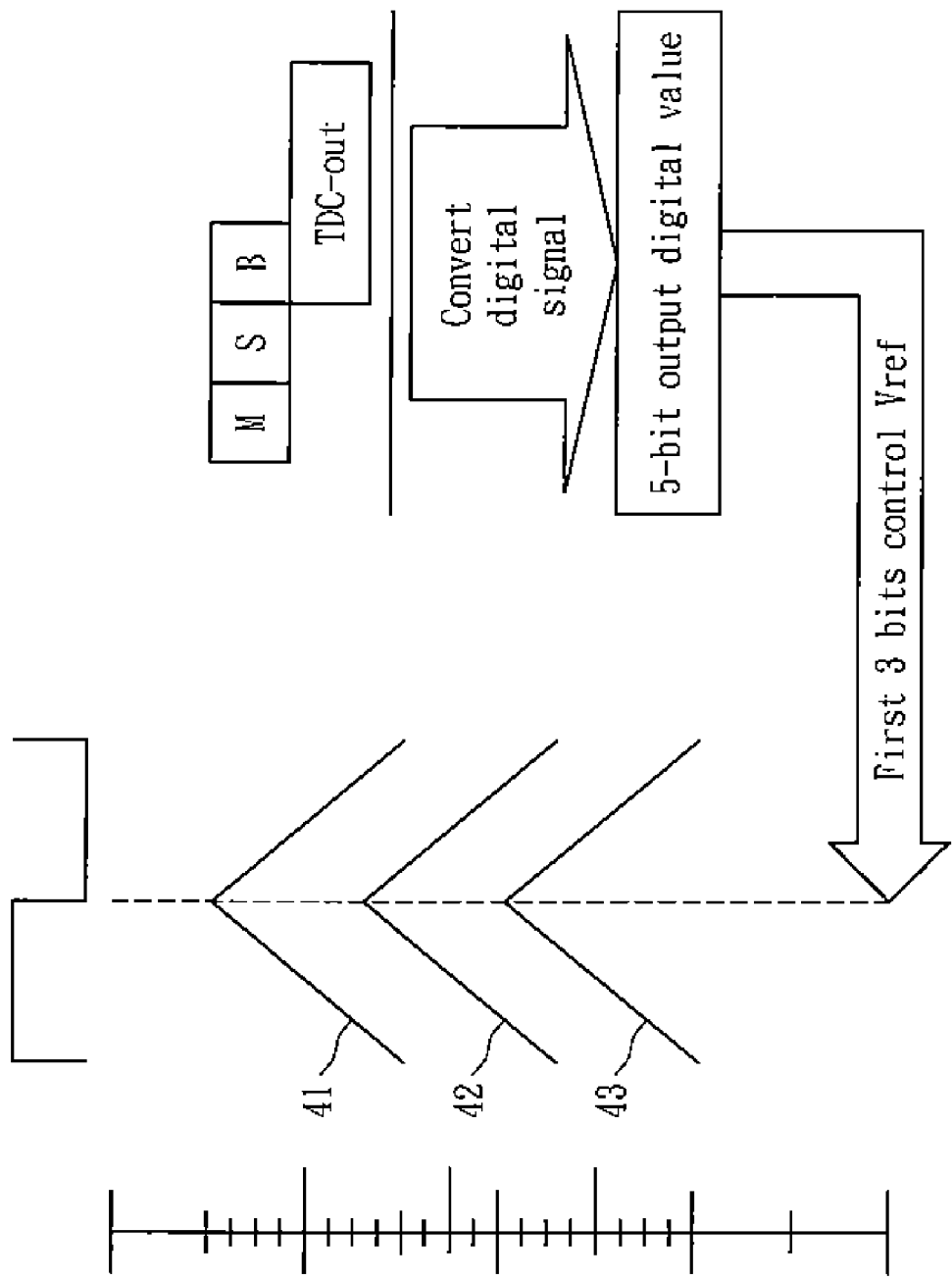
FIG. 3 shows the operation of the quantization method for a sigma-delta modulator in accordance with another embodiment of the present application.

FIG. 3 shows the use of three comparators to overcome the circuit low sampling rate problem to achieve high circuit performance. Three sawtooth waves 41, 42 and 43 are used, and the sawtooth waves 41, 42 and 43 correspond to different voltage levels. The corresponding voltages of adjacent sawtooth waves 41 and 42, or sawtooth waves 42 and 43, are partially overlapped, so as to resolve the low OSR problem and obtain the benefits of larger voltage range covered by three sawtooth waves. The method to generate the reference voltage adjustment value is substantially the same as that shown in FIG. 2.

In this embodiment, if N=5, OSR only needs to be larger than 2×π=6.28. Therefore, the limitation of the present application is much less than that of prior art, so that the present application is more suitable for the sigma-delta modulation ADC design.

In summary, the present application uses an extra voltage level tracing device to adjust the pulse width modulator, so as to achieve the objectives of less circuit power consumption and higher circuit performance. By tracing and comparing voltages, the high resolution quantizer can be obtained with minimal time-resolution.

More specifically, the quantizer of the present application converts the comparing voltages from voltage domain into time domain, and decreases the number of the comparators to achieve the objective of low power consumption. This circuit is suitable for the sigma-delta modulator of mid/high speed sampling rate (320 to 640 Msps) and high resolution (10 to 14 bits) and high frequency band (20 to 40 MHz).

The quantizer of the sigma-delta modulator of the present application uses new circuitry in place of the traditional quantizer using flash ADC in loop, so as to decrease power consumption. As mentioned above, the power consumption of flash ADC is proportional to the square of the resolution. Therefore, when the resolution of the flash ADC is increased, the power consumption is significantly increased. The new design of the present application uses oversampling feature of the sigma-delta modulator, so as to obtain equivalent circuit performance with low power consumption.

The above-described embodiments of the present application are intended to be illustrative only. Numerous alternative embodiments may be devised by those skilled in the art without departing from the scope of the following claims.

What is claimed is:

1. A quantizer of a sigma-delta modulator, comprising:
a pulse width modulator configured to receive an input signal and perform a pulse width modulation on the input signal according to at least one sawtooth wave and at least one reference voltage to generate a pulse width modulation signal;
a converter connected to an output of the pulse width modulator and configured to digitize the pulse width modulation signal to generate an output digital value; and
a voltage level tracing device connected to an output of the converter and configured to receive the output digital value to generate a reference voltage adjustment value, the reference voltage adjustment value being transmitted to the pulse width modulator to adjust the reference voltage, so as to change a next corresponding voltage level of the sawtooth wave to trace the input signal.

2. The quantizer of a sigma-delta modulator of claim 1, wherein the reference voltage adjustment value is obtained by calculating previous reference voltage adjustment value and the output digital value.

3. The quantizer of a sigma-delta modulator of claim 1, wherein the reference voltage adjustment value is obtained by calculating the first m bits of previous reference voltage adjustment value and the first m bits of the output digital value, the reference voltage adjustment value has 2m−1 bits of which one bit is overlapped.

4. The quantizer of a sigma-delta modulator of claim 3, wherein the first m bits of the reference voltage adjustment value of 2m−1 bits are employed to change the next corresponding voltage level of the sawtooth wave.

5. The quantizer of a sigma-delta modulator of claim 3, wherein m is equal to 3.

6. The quantizer of a sigma-delta modulator of claim 1, wherein the pulse width modulation is performed by comparing the reference voltage and the input signal subtracting the sawtooth wave.

7. The quantizer of a sigma-delta modulator of claim 1, wherein a corresponding voltage range of the sawtooth wave is smaller than that of the input signal.

8. The quantizer of a sigma-delta modulator of claim 1, wherein the corresponding voltage level of the sawtooth wave is defined by a first voltage range and a second voltage range, the first voltage range comprises the second voltage range, and the corresponding voltage level of the sawtooth wave is within the second voltage range.

9. The quantizer of a sigma-delta modulator of claim 8, wherein the first voltage range is defined by previous reference voltage adjustment value, and the second voltage range is defined by the output digital value.

10. The quantizer of a sigma-delta modulator of claim 1, wherein there are plural sawtooth waves corresponding to different voltage levels, and corresponding voltage levels of adjacent sawtooth waves are partially overlapped.

11. A sigma-delta modulator, comprising:
an adder;
a filter connected to an output of the adder;
a quantizer of one of claims 1 to 10, connected to an output of the filter; and
a digital-to-analog converter connected to an output of the quantizer, and configured to transmit output data of the quantizer to the adder.

12. A quantization method for a sigma-delta modulator, comprising:
receiving an input signal;
performing pulse width modulation on the input signal according to at least one sawtooth wave and at least one reference voltage to generate a pulse width modulation signal;
performing time-to-digital conversion to digitize the pulse width modulation signal so as to generate an output digital value; and
generating a reference voltage adjustment value according to the output digital value to adjust the reference voltage, so as to change a next corresponding voltage level of the sawtooth wave to trace the input signal.

13. The quantization method of claim 12, wherein the reference voltage adjustment value is obtained by calculating previous reference voltage adjustment value and the output digital value.

14. The quantization method of claim 12, wherein the reference voltage adjustment value is obtained by calculating the first m bits of previous reference voltage adjustment value and the first m bits of the output digital value, the reference voltage adjustment value has 2m−1 bits of which one bit is overlapped.

15. The quantization method of claim 14, wherein the first m bits of the reference voltage adjustment value of 2m−1 bits are employed to change the next corresponding voltage level of the sawtooth wave.

16. The quantization method of claim 12, wherein the pulse width modulation is performed by comparing the reference voltage and the input signal subtracting the sawtooth wave.

17. The quantization method of claim 12, wherein corresponding voltage range of the sawtooth wave is smaller than that of the input signal.

18. The quantization method of claim 12, wherein the corresponding voltage level of the sawtooth wave is defined by a first voltage range and a second voltage range, the first voltage range comprises the second voltage range, and the corresponding voltage level of the sawtooth wave is within the second voltage range.

19. The quantization method of claim 18, wherein the first voltage range is defined by previous reference voltage adjustment value, and the second voltage range is defined by the output digital value.

20. The quantization method of claim 12, wherein there are plural sawtooth waves corresponding to different voltage levels, and corresponding voltage levels of adjacent sawtooth waves are partially overlapped.

* * * * *